(12) United States Patent
Scicluna et al.

(10) Patent No.: US 7,554,811 B2
(45) Date of Patent: Jun. 30, 2009

(54) DATA STORAGE DEVICE CARRIER AND CARRIER TRAY

(75) Inventors: Mark Scicluna, Hampshire (GB); Adam Wade, Hampshire (GB)

(73) Assignee: Xyratex Technology Limited, Havant, Hampshire (GB)

( * ) Notice: Subject to any disclaimer, the term of this patent is extended or adjusted under 35 U.S.C. 154(b) by 432 days.

(21) Appl. No.: 11/290,817

(22) Filed: Dec. 1, 2005

(65) Prior Publication Data

US 2007/0127202 A1   Jun. 7, 2007

(51) Int. Cl.
H05K 7/14   (2006.01)

(52) U.S. Cl. .................. 361/725; 361/726; 361/727; 361/753; 361/759; 361/816; 312/223.1; 312/223.2

(58) Field of Classification Search ............ None
See application file for complete search history.

(56) References Cited

U.S. PATENT DOCUMENTS

| | | | |
|---|---|---|---|
| 5,588,728 A * | 12/1996 | Eldridge et al. | 312/332.1 |
| 6,084,768 A * | 7/2000 | Bolognia | 361/685 |
| 6,288,902 B1 * | 9/2001 | Kim et al. | 361/725 |
| 6,373,696 B1 * | 4/2002 | Bolognia et al. | 361/687 |
| 6,542,383 B1 * | 4/2003 | Tsuyuki et al. | 361/816 |
| 6,560,098 B1 * | 5/2003 | Beinor et al. | 361/685 |
| 6,661,651 B1 | 12/2003 | Tanzer et al. | |
| 6,683,785 B1 * | 1/2004 | Chen | 361/685 |
| 6,867,969 B2 * | 3/2005 | Hwang | 361/690 |
| 6,876,547 B2 | 4/2005 | McAlister | |
| 6,879,495 B2 * | 4/2005 | Jiang | 361/818 |
| 7,315,445 B2 * | 1/2008 | Kirby et al. | 361/685 |

\* cited by examiner

*Primary Examiner*—Boris L Chervinsky
(74) *Attorney, Agent, or Firm*—Pillsbury Winthrop Shaw Pittman, LLP

(57) ABSTRACT

Various arrangements of carrier trays and carriers for data storage devices, such as disk drives, are disclosed. The arrangements of carrier trays and carriers are arranged to be rigid, and therefore more resistant to vibration arising from operation of the data storage device in the tray and neighboring data storage devices, and/or easier to use.

4 Claims, 9 Drawing Sheets

DATA STORAGE DEVICE CARRIER AND CARRIER TRAY

CROSS REFERENCE TO RELATED APPLICATION

This patent application is related to co-pending U.S. patent application Ser. No. 11/290,816, entitled "Data Storage Device Carrier and Carrier Tray", filed on Dec. 1, 2005. The entire contents of which is hereby incorporated by reference.

The present invention relates to a data storage device carrier and data storage device carrier tray.

As is well known, data storage devices, such as hard disk drives and the like, are used to store data. In many applications, plural data storage devices are mounted in carriers that are housed in a single chassis and that are removable therefrom for maintenance or replacement of the data storage devices as and when necessary. Such applications include for example use by end users of the data storage devices for data storage purposes, and for testing of the data storage devices during manufacture. In practice, it is of course desirable to fit as many data storage devices in a single chassis as possible in order to save space. Fitting many data storage devices in a single chassis brings problems associated with vibration arising from one data storage device (in the case of hard disks for example) affecting others in the chassis and with temperature given that data storage devices typically generate heat during operation. Moreover, it is desirable for it to be simple and straightforward to swap carriers with their data storage devices in and out of the chassis and for operators to know when a data storage device has been properly mounted in the chassis.

Many examples of data storage device carriers are known and are in use. Reference is made for example to U.S. Pat. Nos. 6,560,098, 6,661,651 and 6,876,547, which show different arrangements for a hard disk drive carrier and the various components that make up the carrier.

According to a first aspect of the present invention, there is provided a data storage device carrier for carrying a data storage device and for removable mounting in a data storage device chassis, the carrier comprising a latching handle by which the carrier can be latched into locking engagement with a data storage device chassis and unlatched therefrom, the latching handle having at least a first detent position when in its unlatched configuration.

Because the handle of this aspect has a detent position when in its unlatched configuration, if for example the carrier is loaded into a chassis and the handle is not latched and is instead in the detent position (at which the handle will typically project outwards somewhat), an operator can readily see that the carrier has not been fully latched into the chassis. Thus, from a simple visual inspection or even by feel (e.g. by running a hand along the fronts of the carriers in the chassis), an operator can readily notice that a particular carrier needs to be latched properly into the chassis. This is particularly helpful in the case where the chassis is part of a larger rack of chassis holding many data storage devices. For example, known racks of disk drives may contain 1000 or more disk drives.

The handle is preferably biased towards the first detent position when in its unlatched configuration. This preferred arrangement helps to ensure that the handle is in the first detent position when in its unlatched configuration, making it easier for an operator to see by visual inspection that the carrier has not been fully latched into the chassis.

The handle may have at least a first and a second detent position when in its unlatched configuration. The first detent position may be where the handle is only slightly pivoted away from its fully latched position (which may correspond to the position mentioned above). The second detent position may be where the handle is more fully pivoted away from its fully latched position at which the carrier is ready to be loaded into a chassis. When the handle is in the second detent position, an operator can therefore readily see that the carrier is ready to be loaded into a chassis.

In a preferred embodiment, the handle is pivotally mounted in the carrier, the handle comprising at least one cam surface that pivots with the handle as the handle is pivoted, the carrier comprising a cam follower that engages with the cam surface to provide the first detent position.

The cam surface is preferably mounted for rotation about the centre of rotation of the handle.

In a preferred embodiment, the cam follower comprises a biased finger that follows the cam surface as the cam surface rotates with the handle, the cam surface having a recess into which the finger is biased to drive the handle into the first detent position.

In a preferred embodiment, the cam surface has plural recesses into which the finger is respectively biased to define corresponding plural detent positions.

In an embodiment, the biased finger of the cam follower provides a bias of the handle towards the detent position.

According to a second aspect of the present invention, there is provided a data storage device carrier tray constructed and arranged to be incorporated into a data storage device carrier that is for carrying a data storage device and for removable mounting in a data storage device chassis, the carrier tray having a base, opposed side walls and at least one end wall, at least one end of at least one of the side walls being formed with an extension portion which passes across the junction between the end wall and said end of said at least one of the side walls.

This provides the carrier tray with a very strong and rigid corner (or corners), which helps to ensure that the carrier tray, and the carrier in which it is incorporated in practice, is rigid and therefore less prone to interference from vibrations arising from operation of the data storage device in the carrier in use and/or operation of other data storage devices in neighbouring carriers in use.

In a preferred embodiment, at least one end of each of the side walls is formed with an extension portion which passes around the respective junction between the end wall and said end of the side wall.

The carrier tray is conveniently initially formed as a generally planar sheet, the sheet being bent to form the side walls, the extension portion and the end wall.

According to a third aspect of the present invention, there is provided a data storage device carrier for carrying a data storage device and for removable mounting in a data storage device chassis, the carrier comprising: a data storage device carrier tray on which a data storage device can be placed, the carrier tray having a base, opposed side walls and at least one end wall, at least one end of at least one of the side walls being formed with an extension portion which passes across the junction between the end wall and said end of said at least one of the side walls; runners arranged generally along the carrier tray side walls to facilitate sliding of the carrier into and out of a data storage device chassis, at least one end of at least one of the runners being formed with an extension portion which passes across a portion of the carrier tray end wall; and, a front part having a latching handle which can be operated to latch the carrier into and unlatch the carrier from a data storage device chassis; the carrier tray, at least one of the runners and the front part being connected to each other by at least one fastener that passes through said extension portion of said at least one carrier tray side wall, through said carrier tray end wall, through the extension portion of said at least one runner, and into the front part (though not necessarily in that order).

This construction, by which the carrier tray, at least one of the runners and the front part are "sandwiched" to each other, makes a strong and rigid connection between the various components, which helps to ensure that the carrier is rigid and therefore less prone to interference from vibrations arising from operation of the data storage device in the carrier in use and/or operation of other data storage devices in neighbouring carriers in use.

In a preferred embodiment, at least one end of each of the carrier tray side walls is formed with an extension portion which passes around the respective junction between the end wall and said end of the side wall, each of the runners is formed with an extension portion which passes across a portion of the carrier tray end wall, and the carrier tray, the runners and the front part are connected to each other by plural fasteners, at least one of said fasteners passing through the extension portion of one carrier tray side wall, through said carrier tray end wall, through the extension portion of one runner, and into the front part (though not necessarily in that order), and at least one of said fasteners passing through the extension portion of the other carrier tray side wall, through said carrier tray end wall, through the extension portion of the other runner, and into the front part (though not necessarily in that order).

In a preferred embodiment, the carrier comprises an electromagnetic interference shield between the front part and the carrier tray end wall, the at least one fastener passing through the electromagnetic interference shield and into the front part. In this embodiment, in which an EMI shield is provided, the EMI shield is also "sandwiched" to the other components, ensuring that rigidity of the carrier is maintained.

The fastener preferably passes through said extension portion of said at least one carrier tray side wall, through said carrier tray end wall, through the extension portion of said at least one runner, through the electromagnetic interference shield and into the front part in that order. However, the parts may be arranged so that the fastener passes through the parts in a different order, depending for example on precisely how the parts are constructed and arranged.

According to a fourth aspect of the present invention, there is provided a data storage device carrier tray constructed and arranged to be incorporated into a data storage device carrier that is for carrying a data storage device and for removable mounting in a data storage device chassis, the carrier tray having a base and opposed side walls, the junction between the base and at least one of the side walls being over-bent so as to have a convex cross-sectional shape whereby movement of the side walls towards or away from each other is principally accommodated at said junctions.

Data storage devices come in a range of different physical size. Moreover, data storage devices and carriers are subject to manufacturing tolerances, meaning that whilst there might be a standard nominal size, in practice the actual size can vary from product to product. The carrier tray of this aspect can accommodate data storage devices of different physical size, and/or accommodate variations in the size of the carrier tray owing to manufacturing tolerances, without appreciable bowing of the base or side walls of the carrier tray. This is because the bulk of the movement of the side walls is taken up at the junction of the at least one side wall and the base, rather than by distortion of the side wall and/or base. In contrast, prior art carriers and carrier trays have tended to bow at the base and/or side wall, which is undesirable for a number of reasons as will be discussed further below.

In a preferred embodiment, the junctions between the base and each of the side walls have the same or a similar cross-sectional shape.

In one embodiment, there is provided data storage device carrier tray constructed and arranged to be incorporated into a data storage device carrier that is for carrying a data storage device and for removable mounting in a data storage device chassis, the data storage device having a recess on its under surface defined by the edge of the under surface, the carrier tray having a base having a first surface on which a data storage device can be received and a second surface, the carrier tray having a forward end and a rearward end, the base having plural air holes therethrough, the air holes being arranged so that, when a data storage device is received on the tray, air passing over the first surface of the base from the forward end can pass through the base, over a part of the second surface and back through the base to flow across the recess under the data storage device.

The carrier tray of this embodiment ensures that there is a good flow of air under the data storage device even in the case where there is insufficient space to provide dedicated air flow channels in the base of the tray under the data storage device, which can occur when the packing density of data storage devices in a chassis is high. Indeed, where the packing density of data storage devices in a chassis is high, it is particularly important that there is a good flow of air under the data storage device in order to cool the device adequately during operation.

In an embodiment, the tray has at least a first air hole positioned at least partly forward of the front edge of the under surface of the data storage device and at least a second air hole positioned at least partly rearward of the front edge of the data storage device and under the recess so that, when a data storage device is received on the tray, air passing over the base from the forward end can pass through the first air hole, under the base, and through the second air hole to flow across the recess under the data storage device.

In an embodiment, the tray has at least one air hole positioned such that a front part of said air hole is positioned forward of the front edge of the under surface of the data storage device and a rear part of said air hole is positioned rearward of the front edge of the data storage device and under the recess so that, when a data storage device is received on the tray, air passing over the base from the forward end can pass through the front part of said air hole, under the base, and through the rear part of said air hole to flow across the recess under the data storage device.

Preferably the tray has at least one air hole positioned such that, when a data storage device is received on the tray, said air hole is under the data storage device towards the rear of the data storage device so that air flowing across the recess under the data storage device can exit through said air hole. This provides an escape route for (warm) air flowing under the data storage device.

In an embodiment, the tray has at least a first air hole positioned at least partly forward of the rear edge of the under surface of a data storage device received on the tray and under the recess and at least a second air hole positioned at least partly rearward of the rear edge of the data storage device so that, when a data storage device is received on the tray, air flowing across the recess under the data storage device can exit through said first air hole and enter through said second air hole.

In an embodiment, the tray has at least one air hole positioned such that a front part of said air hole is positioned forward of the rear edge of the under surface of the data storage device and under the recess and a rear part of said air hole is positioned rearward of the rear edge of the data storage device so that, when a data storage device is received on the tray, air flowing across the recess under the data storage device can exit through the front part of said air hole and enter through the rear part of said air hole.

In an embodiment, the carrier tray has a front wall at its forward end, the front wall having air holes therethrough, the air holes being arranged to achieve a greater air flow rate towards the top and bottom surfaces of a data storage device received on the tray than towards the central portion of the face of the data storage device that is adjacent the front wall of the carrier tray base.

In another embodiment, there is provided a data storage device carrier for carrying a data storage device and for removable mounting in a data storage device chassis, the data storage device having a recess on its under surface defined by the edge of the under surface, the carrier comprising: a data storage device carrier tray having a base having a forward end and a rearward end, the base having a first surface on which a data storage device can be received and a second surface, the carrier tray having a forward end and a rearward end, the base having plural air holes therethrough; and, an electromagnetic interference shield adjacent the forward end of the carrier tray, the electromagnetic interference shield having plural air holes therethrough; whereby air can pass through the electromagnetic interference shield air holes, through the forward end of the carrier tray base, over part of the first surface of the base, through the base, over a part of the second surface and back through the base to flow across the recess under the data storage device.

As above, the carrier of this embodiment ensures that there is a good flow of air under the data storage device even in the case where there is insufficient space to provide dedicated air flow channels in the base of the tray under the data storage device.

Preferably, the electromagnetic interference shield air holes are arranged to achieve a greater air flow rate towards the top and bottom surfaces of the data storage device received on the tray than towards the central portion of the face of the data storage device that is adjacent the forward end of the carrier tray base. This serves to promote further a good flow of air under the data storage device. Other components that are in the air flow path may have similarly arranged air flow holes.

In an embodiment, the tray has at least a first air hole positioned at least partly forward of the front edge of the under surface of the data storage device and at least a second air hole positioned at least partly rearward of the front edge of the data storage device and under the recess so that, when a data storage device is received on the tray, air passing over the base from the forward end can pass through the first air hole, under the base, and through the second air hole to flow across the recess under the data storage device.

In an embodiment, the tray has at least one air hole positioned such that a front part of said air hole is positioned forward of the front edge of the under surface of the data storage device and a rear part of said air hole is positioned rearward of the front edge of the data storage device and under the recess so that, when a data storage device is received on the tray, air passing over the base from the forward end can pass through the front part of said air hole, under the base, and through the rear part of said air hole to flow across the recess under the data storage device.

In an embodiment, the tray has at least one air hole positioned such that, when a data storage device is received on the tray, said air hole is under the data storage device towards the rear of the data storage device so that air flowing across the recess under the data storage device can exit through said air hole.

In an embodiment, the tray has at least a first air hole positioned at least partly forward of the rear edge of the under surface of a data storage device received on the tray and under the recess and at least a second air hole positioned at least partly rearward of the rear edge of the data storage device so that, when a data storage device is received on the tray, air flowing across the recess under the data storage device can exit through said first air hole and enter through said second air hole.

In an embodiment, the tray has at least one air hole positioned such that a front part of said air hole is positioned forward of the rear edge of the under surface of the data storage device and under the recess and a rear part of said air hole is positioned rearward of the rear edge of the data storage device so that, when a data storage device is received on the tray, air flowing across the recess under the data storage device can exit through the front part of said air hole and enter through the rear part of said air hole.

In an embodiment, the carrier tray has a front wall at its forward end, the front wall having air holes therethrough corresponding to the electromagnetic interference shield air holes.

In another embodiment, there is provided a data storage device carrier tray constructed and arranged to be incorporated into a data storage device carrier that is for carrying a data storage device and for removable mounting in a data storage device chassis, the carrier tray having a base having a forward end and a rearward end, the base comprising a front wall at its forward end, the front wall having air holes therethrough, the air holes being arranged such that as air is passed through the front wall to a data storage device received on the tray, a greater air flow rate is achieved towards the top and bottom surfaces of the data storage device than towards the central portion of the face of the data storage device that is adjacent the front wall of the carrier tray base.

This embodiment may be of particular use in the case where for example the EMI shield or other components in front of the carrier tray do not have air flow holes that are arranged to preferentially direct the flow of air to the top and bottom of the data storage device.

The base may have plural air holes therethrough to allow air to pass through the base.

In the present specification, for convenience reference will be made to the "front", the "rear", the "top", the "bottom", etc., of various parts. It will be understood that this is merely for convenience and by convention, and that no particular orientation of the overall apparatus is to be inferred.

Embodiments of the present invention will now be described by way of example with reference to the accompanying drawings, in which.

Figure 1:
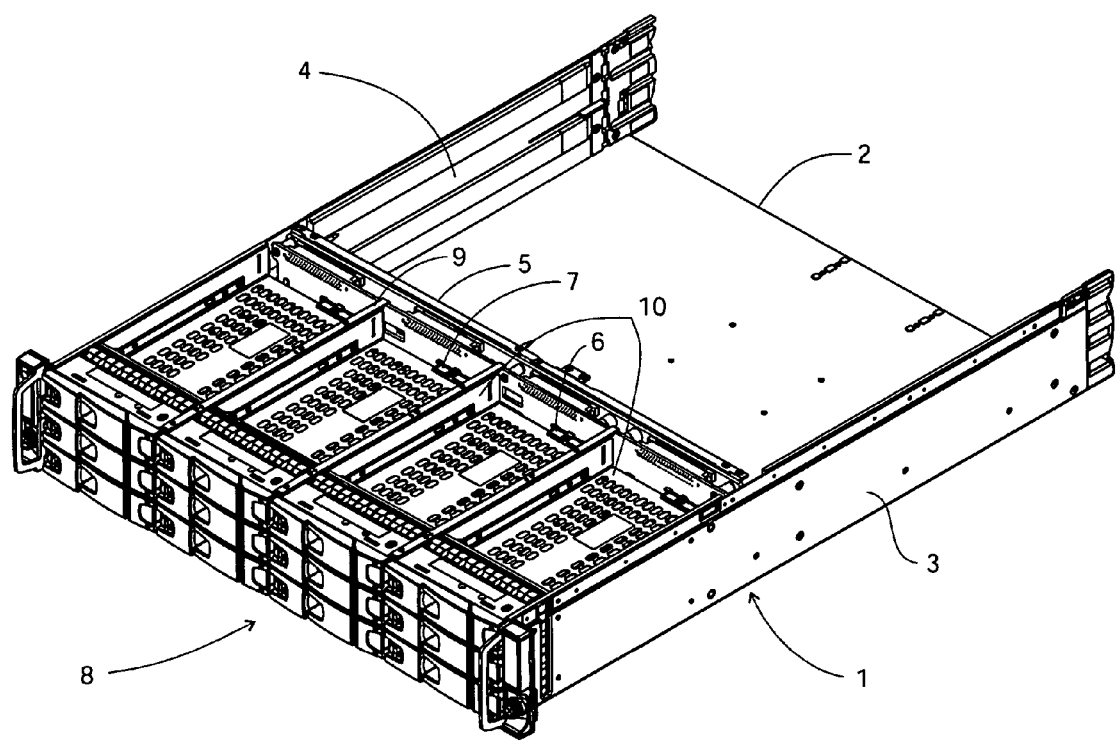
FIG. 1 shows schematically a perspective view of a data storage device chassis with the top removed in order to show plural data storage device carriers.

Referring first to FIG. 1, there is shown a portion of a data storage device chassis 1 having a base 2 and side walls 3,4. In this example, the data storage devices are hard disk drive units. The top of the chassis 1 is omitted from FIG. 1 for clarity. The chassis 1 has a midplane 5 which generally divides the chassis 1 into a front portion, where the disk drives and carriers are located, and a rear portion, where electronics and power supplies and the like are located. The midplane 5 provides electrical and data connections 6,7 for disk drives mounted in use in the chassis 1.

In the first or front end 8 of the chassis 1 there are mounted plural disk drive carriers 10. Again for reasons of clarity, the disk drives themselves are not shown in FIG. 1. The carriers 10 can be inserted into and removed from the front end 8 of the chassis 1. In addition to its side walls 3,4, the chassis 1 has internal dividing walls 9 to define bays in which the carriers 10 are received.

Referring now to FIGS. 2 to 5 in particular, an example of a carrier 10 according to an embodiment of the present invention is generally rectangular in plan and has a forward end 11 and a rearward end 12. The carrier 10 is made up of a carrier tray 13 having a front end 14 and a rear end 15, runners or rails 16 along each long edge of the tray 13, an electromagnetic interference (EMI) shield 17 at the front end 14 of the tray 13, and a so-called front part 18 in front of the EMI shield 17, the front part 18 providing inter alia a latching handle 19.

The handle 19 is a latching handle in that when the carrier 10 with a data storage device therein is loaded into the chassis 1, the handle 19 is pushed fully home and latches the carrier 10 into the chassis 1. There are a number of known arrangements for latching handles 19 for data storage device carriers 10. Typically, these operate by a push-to-lock and a push-to-unlock mechanism. In practice, when the handle 19 is pivoted outwards from the carrier 10 as far as possible, this position being shown in FIG. 4, then the operator can know that the carrier 10 is ready to be inserted into the chassis 2. In a manner known per se, at this position of the handle, a tab 20 on the handle 19 abuts the leading edge of a side wall 3,4 or dividing wall 9 of the chassis 1 when the carrier 10 is pushed into the chassis 1. When the handle 19 is pivoted inwards, the carrier 10 is drawn into the chassis 1 until power and data connections are made between a data storage device in the carrier 10 and the connections 6,7 in the chassis 1. At this point, the handle 19 is typically at the position shown in FIG. 2.

Figure 2:
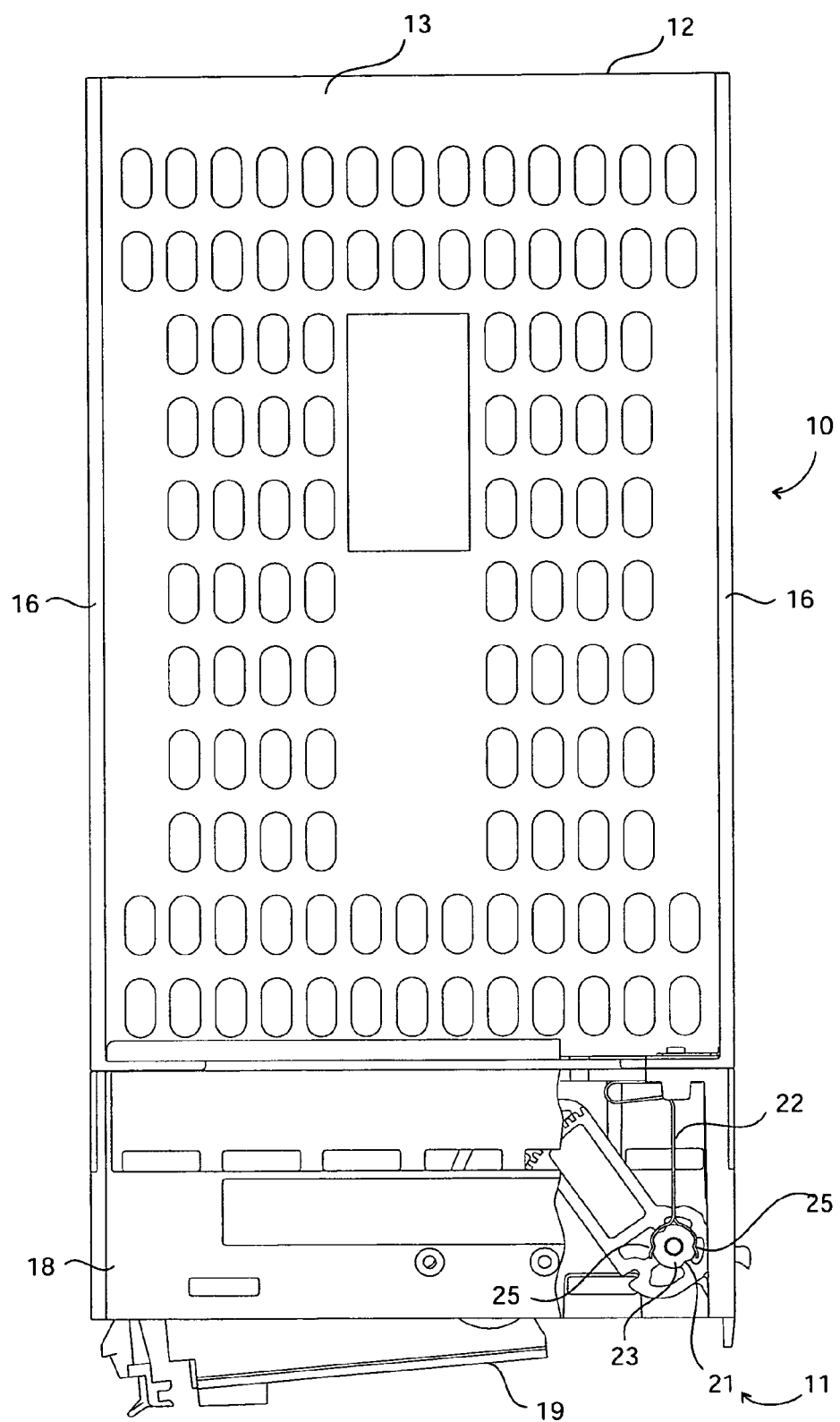
FIG. 2 is a plan view of an example of a data storage device carrier according to an embodiment of the present invention, with a handle in a first detent position.
Figure 3:
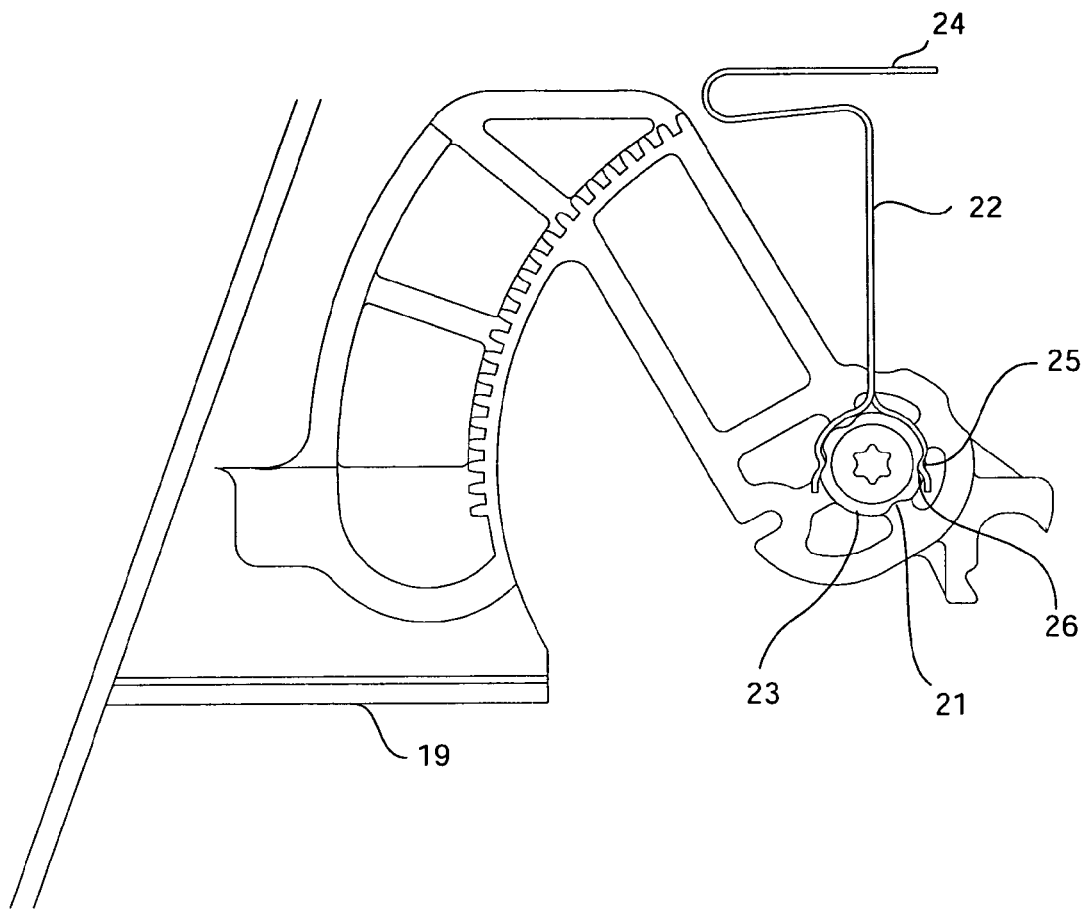
FIG. 3 is a detailed view of a part of the handle shown in FIG. 2.
Figure 4:
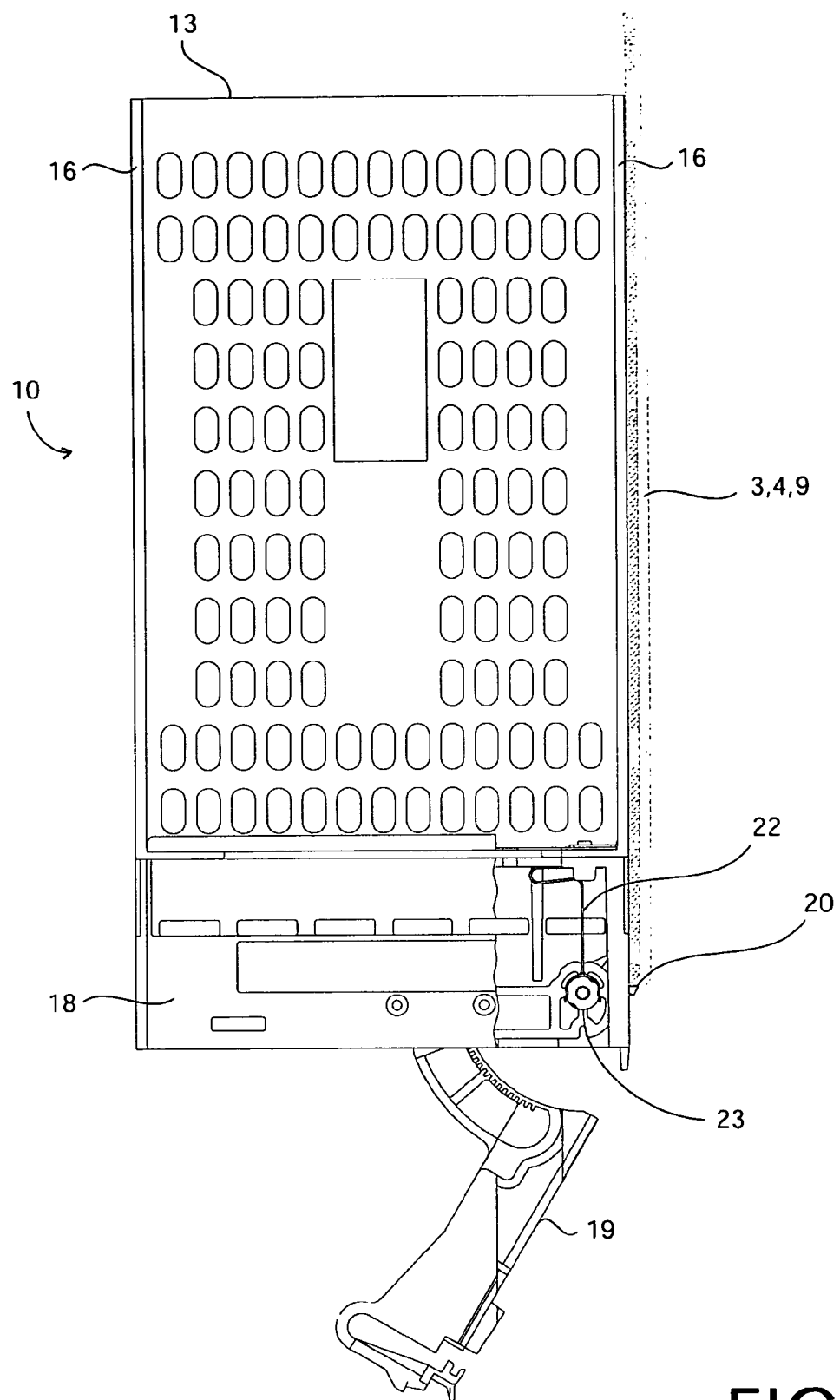
FIG. 4 is a plan view from above of the carrier of FIG. 2 with the handle in a second detent position and showing a part of a chassis in which the carrier is loaded in use.

In the embodiment shown in FIGS. 2 to 4, the handle 19 has a detent mechanism which provides a first detent at the position shown in FIG. 2 and a second detent at the position shown in FIG. 4. In the preferred embodiment, the detent mechanism comprises a set of cam surfaces 21, which pivot with the handle 19, and a cam follower 22, which is fixed to be stationary with respect to the front part 18 and therefore with respect to the pivoting handle 19. In the example shown, the cam surfaces 21 are provided as inwardly curved lateral recesses 21 on a cam post 23 which is coaxially mounted with respect to the pivot axis of the arm 19. The cam follower 22 is a resilient spring arm which is fixed to the front part 18 at one end 24 and which is forked at the other end to provide two fingers 25. Each finger 25 is formed to have an inwardly facing projection 26 which corresponds to the recesses 21 of the cam post 23. In this example, there are four recesses 21 on the cam post 23 arranged in diametrically opposite pairs. This allows the fingers 25 to have a good "grip" on the post 23. It will however be appreciated that other arrangements are possible, including for example a simple, non-forked cam follower 22 which engages with one of only two recesses on the post 23.

The position of the recesses 21 and the arrangement of the cam follower 22 are such that there are two detent positions, corresponding to the fully open position for the handle 19 shown in FIG. 4 and the engaged-but-not-fully-latched position shown in FIG. 2. Thus, in use, an operator can tell by feel that for example the handle 19 is in the fully open position of FIG. 4 because gentle movement of the handle 19 will cause the projections 26 on the cam follower fingers 25 to try to ride up the recesses 21, which is resisted by the spring force of the cam follower 22. Similarly, when the handle 19 has been pushed to the position shown in FIG. 2, the operator can know by feel that the data storage device is engaged with the data and electrical connections 6,7 in the chassis 1 and that the handle 19 is ready to be pushed fully home to latch the carrier 10 into the chassis 1. Moreover, if for example the handle 19 is not in fact pushed fully home (for example, by accident), the action of the fingers 25 on the recesses 21 will tend to drive the handle 19 to the slightly ajar position shown in FIG. 2, which therefore makes it more likely that the operator will notice that the carrier 10 has not been fully latched into the chassis 1. This may be by virtue of the operator noticing by sight that the handle 19 is slightly ajar, or by the operator gently running his or her hand over the handles 19 of the carriers 10 in the chassis 1. In the fully latched position of the handle 19, the fingers 25 of the cam follower 22 are between recesses 21.

In the case of data storage devices that have moving parts, including for example hard disk drives with their rotating disks, it is important to minimise the effect of vibrations arising from operation of one data storage device on other data storage devices in the chassis 1. There are different approaches to achieving this. For example, some manufacturers do not attempt to make the carrier 10 particularly rigid, and do not attempt to make the mounting of the data storage device in the carrier 10 particularly rigid, and instead for example use damping arrangements to damp vibrations. On the other hand, in other approaches, an attempt is made to make the carrier 10 as rigid and stiff as possible. The preferred approach here is to make the carrier 10 as stiff as possible.

Figure 5:
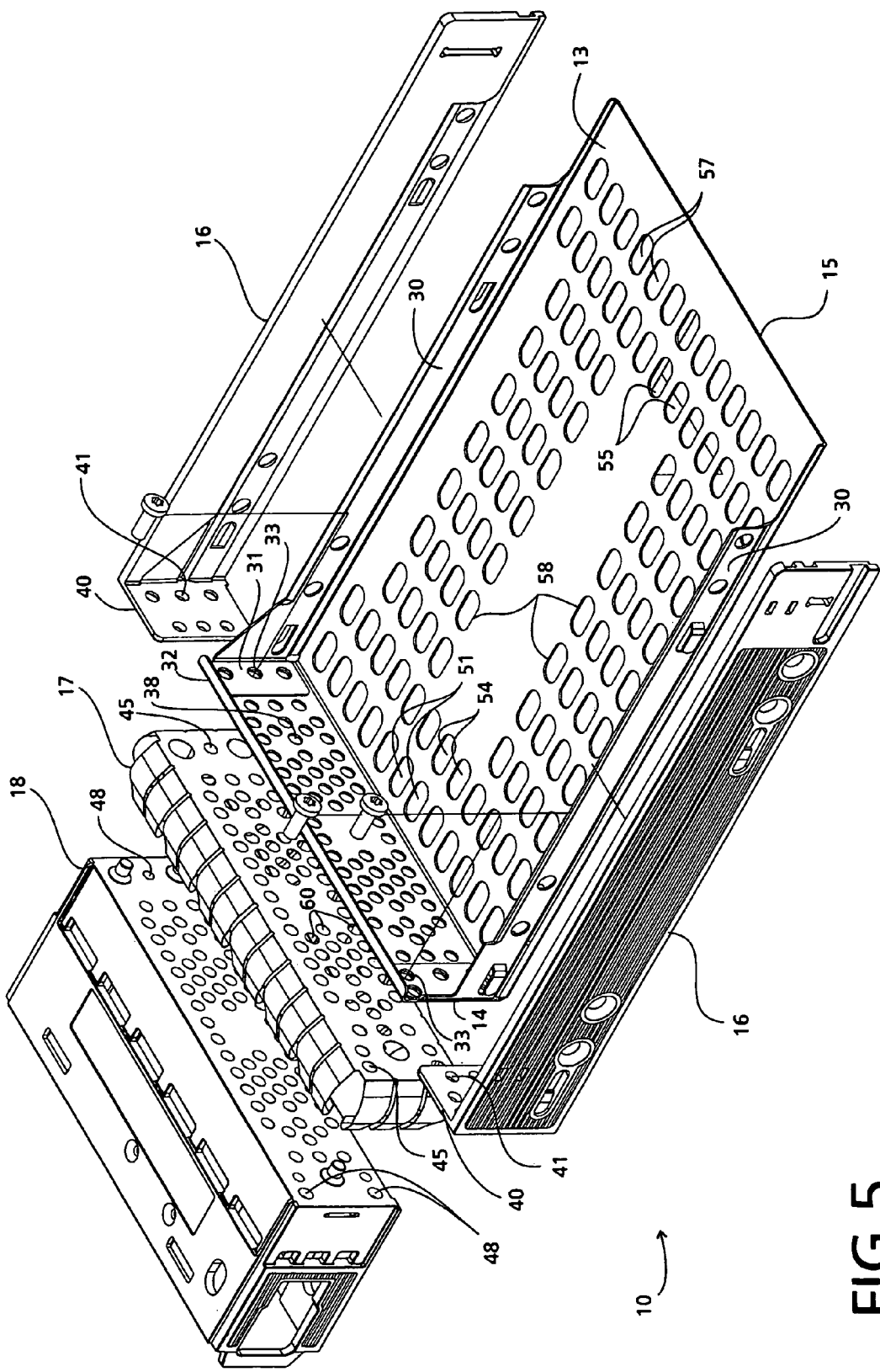
FIG. 5 is an exploded perspective view of the carrier of FIG. 2 (the front part, which includes the handle, being omitted for reasons of clarity)
Figure 6:
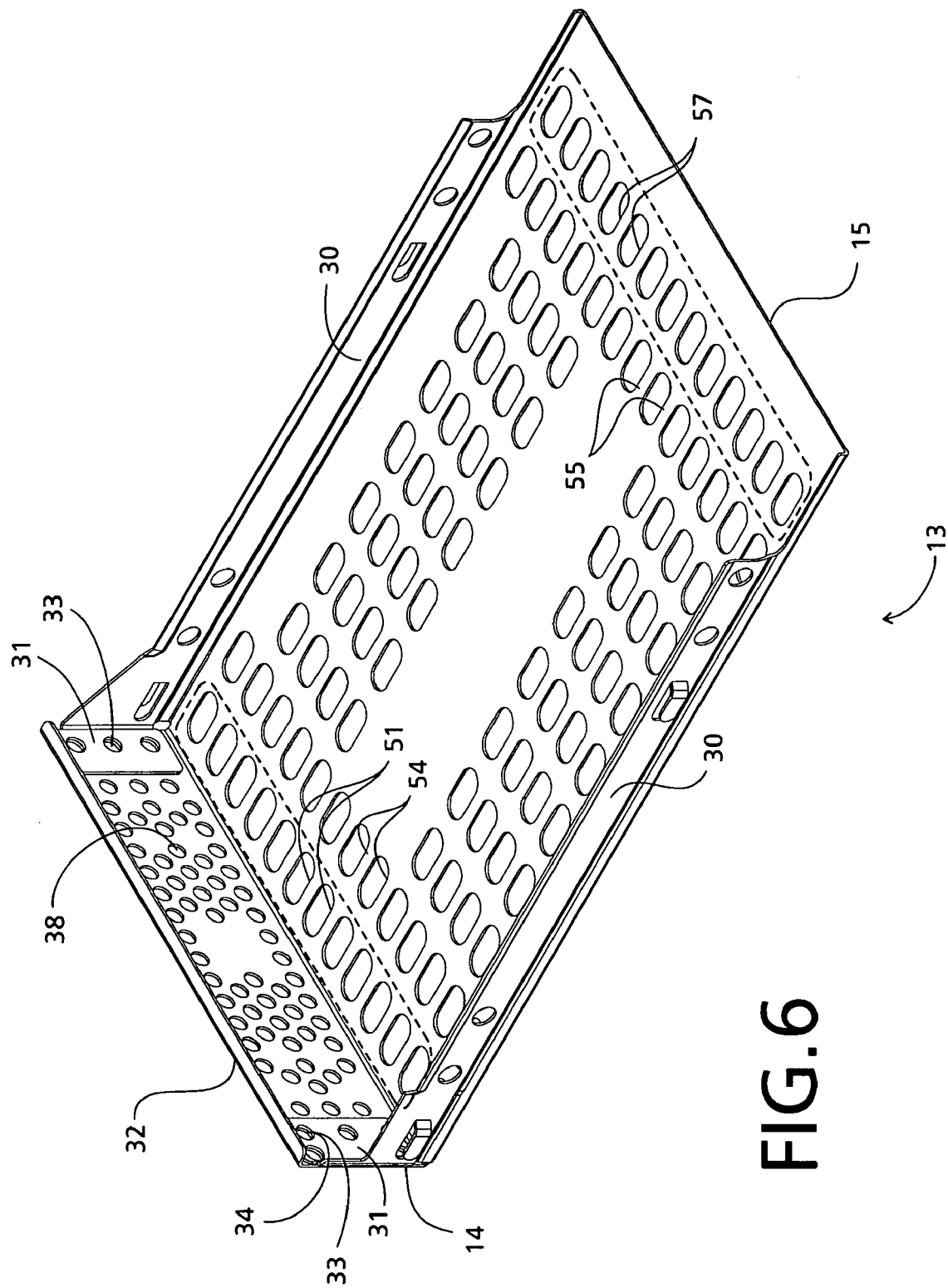
FIG. 6 is a perspective view of an example of a carrier tray according to an embodiment of the present invention.

Referring therefore now to FIGS. 5 and 6 in particular, the carrier tray 13 is initially formed as a planar sheet, which may be formed by for example stamping (particularly in the case of a metal tray 13). Short side walls 30 are then bent upwards. Each side wall 30 has at its front end an extension portion 31 which extends initially beyond the front edge of the tray 13. The extension portions 31 are bent round the front 14 of the tray 13. The leading edge of the tray 13 is then bent upwards to form a front wall 32 of the tray 13. When the carrier 10 is fully assembled as will be discussed further below, the extension portions 31 are clamped rigidly to the front wall 32, which therefore provides a very strong and rigid joint at each corner at the front 14 of the tray 13, which increases the stiffness of the tray 13.

It is noted here that some prior art trays, such as that shown in U.S. Pat. No. 6,560,098, do not have side walls like the side walls 30 of the preferred embodiment. Others, like those disclosed is U.S. Pat. Nos. 6,661,651 and 6,876,547, do not have a front wall like the front wall 32 of the preferred embodiment nor extension portions like the extension portions 31 of the side walls 30 of the preferred embodiment.

Referring now to FIG. 5 in particular, each runner 16 has an extension portion 40 at a right angle to the length of the runner 16. To assemble the preferred carrier 10, the runners 16 are placed adjacent the respective side walls 30 of the tray 13 so that the runner extension portions 40 pass round the front of the front wall 32 of the tray 13. The EMI shield 17 is then offered up to the front wall 32 of the tray 13, and the front part 18 offered up to the EMI shield 17. Fasteners 41, such as screws, bolts, rivets, etc., are then passed through holes 33 in the extension portions 31 of the tray side walls 30, through holes 34 in the tray front wall 32, through holes 41 in the runner extension portions 40, through holes 45 in the EMI shield 17, and into holes 48 in the front part 18. The fasteners 41 are then tightened up as necessary according to the particular type of fastener 41. This arrangement effectively sandwiches the tray extension portions 31, the tray front wall 32, the runner extension portions 40, the EMI shield 17 and the front part 18 together. Overall, this provides a very strong and rigid connection of all of these parts, which results in the carrier 10 overall being rigid and therefore more resistant to the effect of vibrations.

It will be appreciated that variations to the specific arrangement shown in FIG. 5 and discussed above are possible. For example, the tray extension portions 31 could pass round the front of the tray front wall 32, rather than behind. The extension portions 40 of the runners 16 could pass into a space between the tray extension portions 31 and the front wall 32. The runners 16 need not have extension portions and therefore may not be sandwiched with the other components. Other arrangements are possible that still provide the rigid connection that is desirable.

A problem with data storage device carriers is that in general they have to be fairly "universal" so that they can accommodate disk drives or other data storage devices from different manufacturers. In practice, disk drives for example are made to a standard external size. Nevertheless, owing to manufacturing tolerances, the precise size of the data storage device may differ between manufacturers and may differ for the same model from a single manufacturer. Moreover, owing to manufacturing tolerances, there will be differences in size in the components that make up the carrier. In general, the carrier is sized so that it snugly accommodates a data storage device and there is little room for movement. In practice, this means that in the case where for example there is a tray having side walls, those side walls bow outwards to accommodate relatively larger data storage devices or inwards to accommodate smaller data storage devices. This in turn causes the base of the tray to bow upwards towards the data storage device in the first case or outwards away from the data storage device in the second case. This is undesirable in either instance. For example, in the first case, the base of the tray may come into contact with the drive electronics or the like that are typically mounted at least in part along the underneath surface of the data storage device, which is undesirable. In the second case, the outwardly bowing base of the tray or carrier can inhibit or even prevent the carrier being slid into and out of the chassis.

Figure 7:
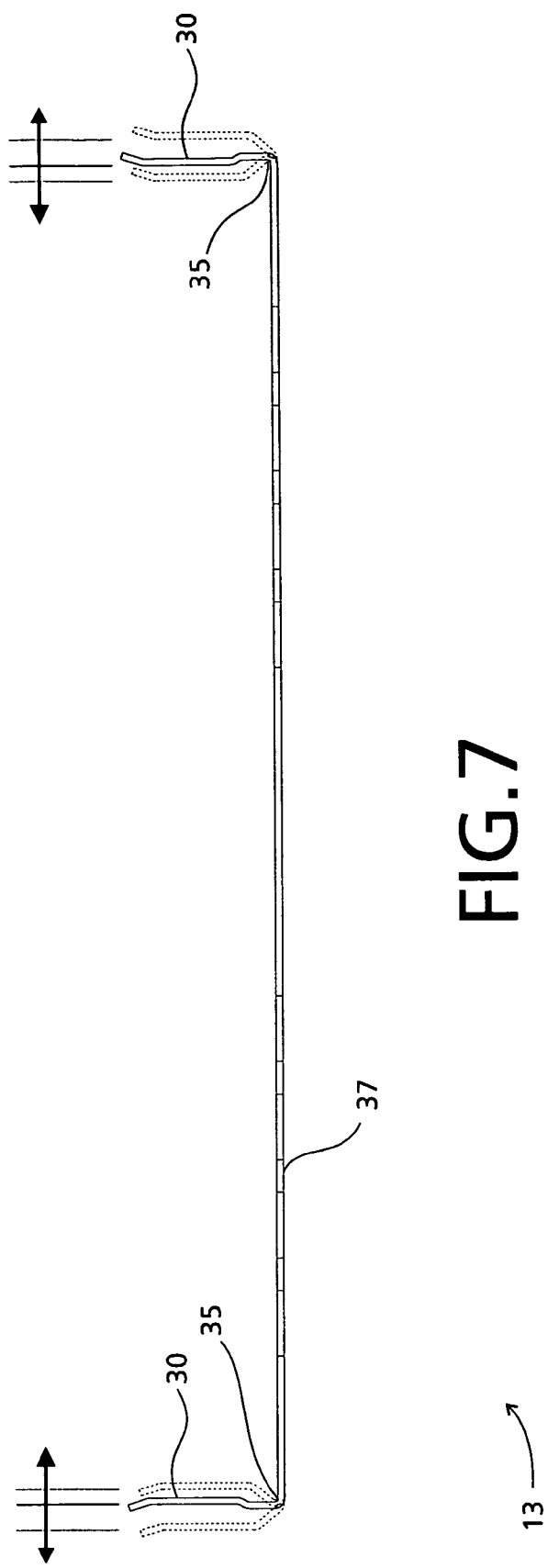
FIG. 7 is a lateral cross-sectional view through an example of a carrier tray according to an embodiment of the present invention.

Referring now particularly to FIG. 7, which shows a lateral cross-sectional view through a tray 13 according to an embodiment of the present invention, the junction 35 between each side wall 30 and the base 37 of the tray 13 is specially shaped so as to ensure that movement of the side walls 30 inwards or outwards to accommodate data storage devices of different sizes principally takes place by movement of the side walls 30 without significant or any bowing of the base 37. In the example shown, the junctions 35 are formed to have a slightly convex shape, which bulges outwardly of the tray 13, and which is formed by over-bending the side walls 30 at the junctions 35 when the side walls 30 are formed. As shown by dot and dashed lines in FIG. 7, this means that the side walls 30 can move inwardly or outwardly by bending in the region of the junction 35 and with no or little bowing of the base 37. It will be seen also that the side walls 30 tend to stay perpendicular to the base 37 and do not taper inwards or outwards, or at least to any significant extent, which is also desirable.

Data storage devices typically generate heat during operation. Accordingly, when data storage devices are housed in a chassis, it is important to ensure that there is a good flow of cooling air across the devices. This is particularly important when the devices are closely spaced, i.e. in the case where the packing density of the devices in the chassis is high. Moreover, it is particularly difficult to provide an adequate flow of cooling air when the packing density is high because there is little space through which the air can flow. Whilst prior art data storage device carriers have for example holes through the carrier tray to encourage air flow, such as those disclosed in U.S. Pat. Nos. 6,560,098 and 6,661,651, those prior art arrangements do not provide a satisfactory flow of cooling air, particularly in the case where the packing density of the data storage devices in the chassis is high.

Figure 9:
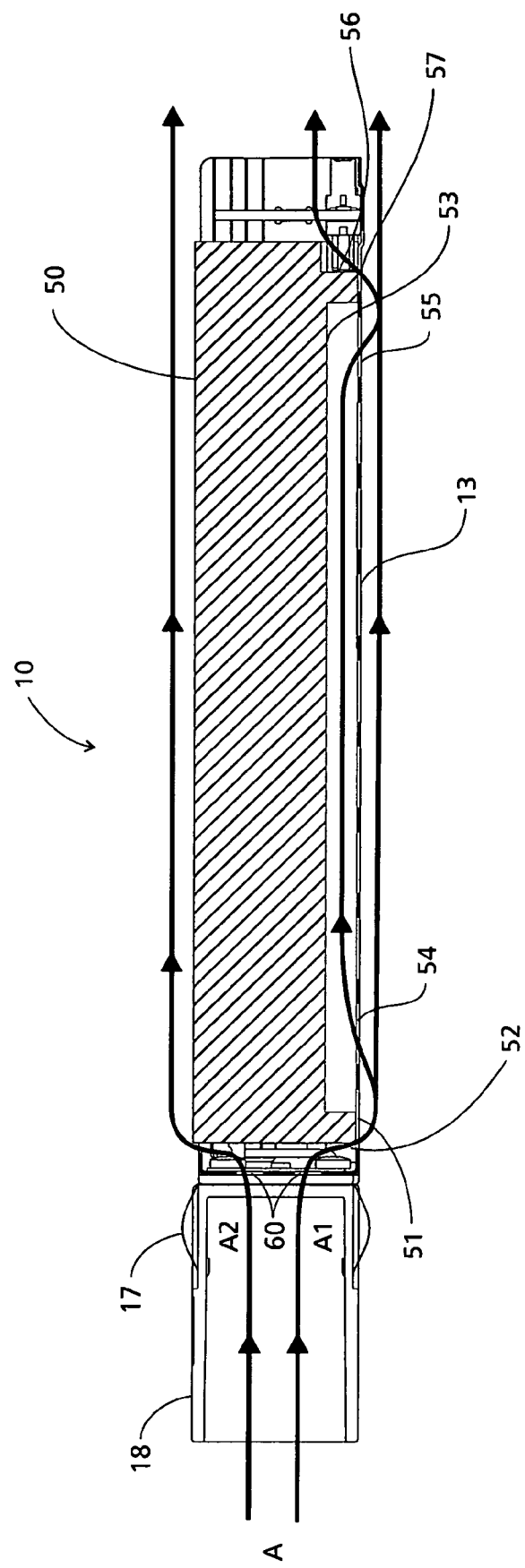

Referring now to FIG. 9 in particular, a preferred embodiment achieves a good flow of air by inter alia carefully arranging air flow holes in the carrier tray 13. In particular, at least one and preferably a row of first air holes 51 is provided in the base of the tray 13 towards its front end 14 at a position such that, when a data storage device 50 is received on the tray 13, at least a part of each of the first row of air holes 51 is positioned forwardly of the leading edge 52 of the data storage device 50 that is in contact with the base of the tray 13. As mentioned, the first row of holes 51 are at least partially in front of the leading edge 52 of the data storage device 50 but they may be positioned wholly in front of the leading edge 52 of the data storage device 50. Data storage devices 50, such as hard disk drives, typically have a central recess 53 on their under surface, the central recess 53 being defined by the edge or rim of the under surface of the data storage device 50. In one preferred embodiment, at least one and preferably a row of second air holes 54 is positioned just behind the first row of air holes 51 at a position so that the second row of air holes 54 is under the recess 53 of the data storage device 50, or at least partially under the recess 53. In this way, air A flowing in a manner known per se through the front part 18 and the EMI shield 17 and over the surface of the base on which the data storage device 50 is received is guided to flow through the first air holes 51 to exit under the base of the tray 13. Now, in practice, when the carrier 10 is located in a housing 1 with other carriers 10, there will be some member under the carrier 10. This may be for example the bottom wall of the chassis 1 in the case of the lowermost carriers 10, or it may be internal dividing walls of the chassis 1, or adjacent data storage devices 50 if there are no such internal dividing walls. In any event, the air A1 that has passed through the first air holes 51 is deflected back through the second air holes 54 to flow through the void defined between the recess 53 of the data storage device 50 and the base of the tray 13.

In another preferred embodiment, the first air holes 51 are long enough in the longitudinal direction of the tray 13 that the front parts of the first air holes 51 are in front of the leading edge of the data storage device 50 and the rear parts of the first air holes 51 are behind the rim of the under surface of the data storage device 50, i.e. the rear parts of the first air holes 51 are located under the recess 53 of the data storage device 50. In this arrangement, the air A1 that has passed through the front parts of the first air holes 51 under the base is then deflected back through the rear parts of the first air holes 51 to flow through the void defined between the recess 53 of the data storage device 50 and the base of the tray 13.

It will be appreciated that the same tray 13 can be used with data storage devices 50 that are of different sizes and/or that are located at different positions on the tray 13 so that, for some data storage devices 50 located at certain positions on the tray 13, air will flow out through the first air holes 51 and back in through the second air holes 52, whereas for other data storage devices 50 or different locations of the data storage devices 50, air will flow out through the front parts of the first air holes 51 and back in through the rear parts of the first air holes 51. Data storage devices 50 may be positioned at different locations depending on for example the nature of the data and electrical connections made to the data storage device 50 and whether for example so-called transition cards or the like are used.

In the preferred embodiment, at least one and preferably a row of third air holes 55 is provided in the base of the tray 13 at a position towards the rear 56 of the data storage device 50 but wholly or partially contained within the recess 53. Thus, the air flow A1 can exit at the rear of the recess 53 through the third row of air holes 55 under the base of the tray 13. This may be sufficient to provide a sufficient exit for air flowing through the carrier 13. If necessary, however, for example depending on precisely where in the tray 13 the data storage device 50 is supported, at least one and preferably a row of fourth row of air holes 57 is positioned at the rear end 15 of the base of the tray 13 such that the fourth air holes 57 are at least partially exposed beyond the rear edge 56 of the data storage device 50 that is in contact with the base of the tray 13 so that the air that has exited the third row of air holes 55 can pass back through the fourth row of air holes 57, from where it can exit the carrier 10. The fourth row of holes 57 may be positioned wholly beyond the rear edge 56 of the data storage device 50 that is in contact with the base of the tray 13.

In another embodiment, the third air holes 53 are long enough in the longitudinal direction of the tray 13 that the front parts of the third air holes 53 are in front of the rear rim of the data storage device 50 (i.e. under the recess 53) and the rear parts of the third air holes 53 are behind the rear edge 56 of the data storage device 50. In this way, air can flow out of the void defined between the recess 53 of the data storage device 50 and the base of the tray 13 through the front parts of the third air holes 53 and be deflected back through the rear parts of the third air holes 53.

Again, it will be appreciated that the same tray 13 can be used with data storage devices 50 that are of different sizes and/or that are located at different positions on the tray 13 so that, for some data storage devices 50 located at certain positions on the tray 13, air will flow out through the third air holes 53 and back in through the fourth air holes 54, whereas for other data storage devices 50 or different locations of the data storage devices 50, air will flow out through the front parts of the third air holes 53 and back in through the rear parts of the third air holes 53.

Thus, a good air flow across the bottom of the data storage device 50 is promoted. Other air holes 58 are provided across the base of the tray 13 to promote an even distribution of air across the data storage device 50.

Figure 8:
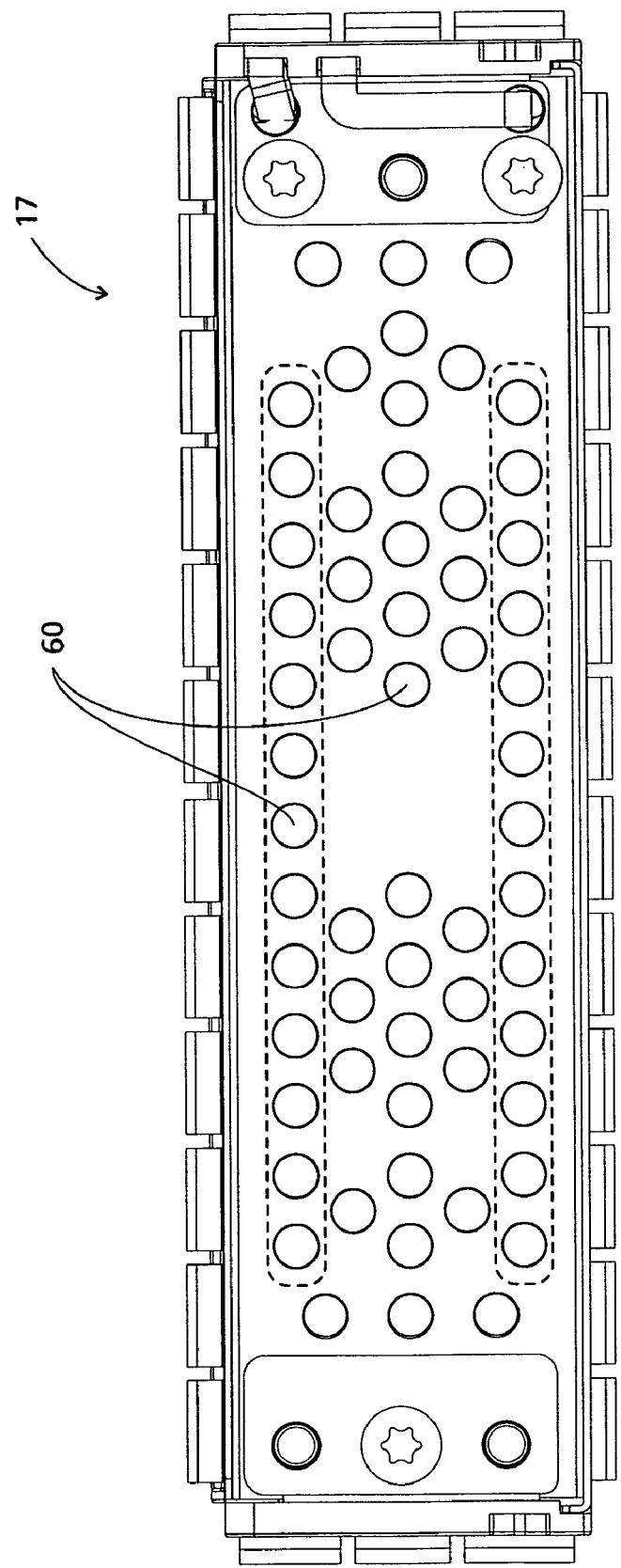
FIG. 8 is an end view of a preferred electromagnetic interference shield of the carrier of FIG. 2; and, FIG. 9 is a schematic longitudinal cross-sectional view through the carrier of FIG. 2 containing a data storage device and showing air flow.

In order to encourage further a good air flow across the top and bottom of the data storage device 50, the air holes 60 conventionally provided in the EMI shield 17 are especially configured in the preferred embodiment. In particular, the air holes 60 through the EMI shield 17 are arranged to promote a greater air flow rate towards the top and bottom edges of the EMI shield 17. For example, referring to FIG. 8 in particular, there may be a greater number of air holes 60 in the top and bottom edges of the EMI shield 17, with a smaller number of air holes 60 in the central part of the EMI shield 17, and/or the air holes 60 in the top and bottom edges of the EMI shield 17 may have a greater total surface area than the air holes 60 in the central part of the EMI shield 17. This encourages good air flow A1 across the bottom of the data storage device 50 and a good air flow A2 across the top of the data storage device 50, whilst avoiding abrupt changes in direction of the air flow. It will be appreciated that it may be desirable to have a greater air flow rate across the bottom than across the top of the data storage device 50, or vice versa, and the air flow holes 60 in the EMI shield 17 may be arranged appropriately. It will be understood that appropriate air flow holes or spaces may be provided through any component in the air flow path, including for example the front part 18 and the front wall 32 of the carrier tray 13 where provided. In such a case, the air holes in the other components may correspond in shape and size to the air holes 60 in the EMI shield 17. For example, comparing FIGS. 5, 6 and 8, it can be seen that the front wall 32 of the carrier tray 13 has air holes 38 therethrough which correspond in shape and number to the air holes 60 in the EMI shield 17.

Indeed, this carrier tray 17 with its carefully positioned air holes 38, which are arranged preferentially to direct air to the top and bottom of the data storage device 50, may be used in the case where for example the EMI shield or other components in front of the carrier tray 17 do not have air flow holes that are arranged to preferentially direct the flow of air to the top and bottom of the data storage device 50.

Embodiments of the present invention have been described with particular reference to the examples illustrated. However, it will be appreciated that variations and modifications may be made to the examples described within the scope of the present invention.

The invention claimed is:

1. A data storage device carrier for carrying a data storage device and for removable mounting in a data storage device chassis, the carrier comprising:

a data storage device carrier tray on which a data storage device can be placed, the carrier tray having a base, opposed side walls and at least one end wall, at least one end of at least one of the side walls being formed with an extension portion which passes across the junction between the end wall and said end of said at least one of the side walls;

runners arranged generally along the carrier tray side walls to facilitate sliding of the carrier into and out of a data storage device chassis, at least one end of at least one of the runners being formed with an extension portion which passes across a portion of the carrier tray end wall; and, a front part having a latching handle which can be operated to latch the carrier into and unlatch the carrier from a data storage device chassis;

the carrier tray, at least one of the runners and the front part being connected to each other by at least one fastener that passes through said extension portion of said at least one carrier tray side wall, through said carrier tray end wall, through the extension portion of said at least one runner, and into the front part (though not necessarily in that order).

2. A data storage device carrier according to claim 1,
wherein at least one end of each of the carrier tray side walls is formed with an extension portion which passes around the respective junction between the end wall and said end of the side wall,
wherein each of the runners is formed with an extension portion which passes across a portion of the carrier tray end wall, and
wherein the carrier tray, the runners and the front part are connected to each other by plural fasteners, at least one of said fasteners passing through the extension portion of one carrier tray side wall, through said carrier tray end wall, through the extension portion of one runner, and into the front part (though not necessarily in that order), and at least one of said fasteners passing through the extension portion of the other carrier tray side wall, through said carrier tray end wall, through the extension portion of the other runner, and into the front part (though not necessarily in that order).

3. A data storage device carrier according to claim 1, comprising an electromagnetic interference shield between the front part and the carrier tray end wall, the at least one fastener passing through the electromagnetic interference shield and into the front part.

4. A data storage device carrier according to claim 3, wherein the fastener passes through said extension portion of said at least one carrier tray side wall, through said carrier tray end wall, through the extension portion of said at least one runner, through the electromagnetic interference shield and into the front part in that order.

* * * * *